(12) United States Patent
Chandra (10) Patent No.: US 11,490,504 B2
(45) Date of Patent: Nov. 1, 2022

(54) HIGH-SPEED TRACE BREAKOUT METHODS AND SYSTEMS

(71) Applicant: DELL PRODUCTS L.P., Round Rock, TX (US)

(72) Inventor: Umesh Chandra, Santa Cruz, CA (US)

(73) Assignee: DELL PRODUCTS L.P., Round Rock, TX (US)

( * ) Notice: Subject to any disclaimer, the term of this patent is extended or adjusted under 35 U.S.C. 154(b) by 0 days.

(21) Appl. No.: 17/384,675

(22) Filed: Jul. 23, 2021

(65) Prior Publication Data

US 2022/0110207 A1   Apr. 7, 2022

Related U.S. Application Data

(63) Continuation of application No. 17/061,483, filed on Oct. 1, 2020, now Pat. No. 11,102,878.

(51) Int. Cl.
*H05K 1/11* (2006.01)
*H05K 1/02* (2006.01)

(52) U.S. Cl.
CPC .......... *H05K 1/0228* (2013.01); *H05K 1/116* (2013.01); *H05K 2201/09509* (2013.01)

(58) Field of Classification Search
CPC .......................... H05K 1/0228; H05K 1/116
See application file for complete search history.

(56) References Cited

U.S. PATENT DOCUMENTS

| | | | |
|---|---|---|---|
| 6,639,154 B1 * | 10/2003 | Cartier ................ | H05K 1/0222 174/262 |
| 6,891,258 B1 * | 5/2005 | Alexander .......... | H05K 1/0231 257/691 |
| 7,358,752 B1 * | 4/2008 | Ramroopsingh .. | G01R 31/2818 324/755.02 |
| 8,002,581 B1 * | 8/2011 | Whiteman, Jr. ... | H01R 13/6589 439/607.18 |
| 9,923,309 B1 * | 3/2018 | Aizawa ................ | H05K 1/184 |

\* cited by examiner

*Primary Examiner* — Jeremy C Norris
(74) *Attorney, Agent, or Firm* — North Weber & Baugh LLP (57) ABSTRACT

A high-speed transmission circuit design reduces or eliminates the presence of unwanted stub-effects and avoids uncontrolled line impedances that in existing circuits cause impedance mismatches that give rise to unwanted reflections and, ultimately, degrade signal integrity, e.g., in belly-to-belly configurations involving Quad Small Form-Factor Pluggable Double Density (QSFP DD) connectors. In various embodiments, by preventing overcrowding of signal lines, the circuit design further reduces crosstalk and increases signal integrity.

20 Claims, 9 Drawing Sheets

APPLY A FIRST VOLTAGE TO A FIRST SIGNAL PATH THAT COMPRISES A FIRST CONNECTOR PIN HAVING A FIRST CONNECTOR PIN LEG, THE FIRST CONNECTOR PIN LEG BEING DISPOSED ON A FIRST SURFACE OF THE PCB, BEING BENT IN A DIRECTION TOWARDS AN EDGE OF THE PCB, AND USING A FIRST VIA TO COUPLE THE FIRST SURFACE TO A FIRST SIGNAL PATH THAT BREAKS OUT IN THE DIRECTION TOWARDS THE EDGE OF THE PCB ⏤ 905

APPLY A SECOND VOLTAGE TO A SECOND SIGNAL PATH THAT COMPRISES A SECOND CONNECTOR PIN HAVING A SECOND CONNECTOR PIN LEG, THE SECOND CONNECTOR PIN LEG BEING DISPOSED ON A SECOND SURFACE OF THE PCB, BEING BENT IN A DIRECTION AWAY FROM THE EDGE OF THE PCB, AND USING A SECOND VIA TO COUPLE THE SECOND SURFACE TO A SECOND SIGNAL PATH THAT BREAKS OUT IN THE DIRECTION AWAY FROM THE EDGE OF THE PCB ⏤ 910

FIG. 9

HIGH-SPEED TRACE BREAKOUT METHODS AND SYSTEMS

CROSS-REFERENCE TO RELATED APPLICATIONS

This patent application is a continuation of and claims the priority benefit of co-pending and commonly-owned U.S. patent application Ser. No. 17/061,483, filed on Oct. 1, 2020, entitled "HIGH-SPEED TRACE BREAKOUT METHODS AND SYSTEMS," listing Umesh Chandra as inventor. Each reference mentioned in this patent document is incorporated by reference herein in its entirety and for all purposes.

BACKGROUND

The present disclosure relates generally to printed circuit board (PCB) design. More particularly, the present disclosure relates to multi-layer circuit structures comprising differential transmission circuitry that uses high-speed surface mount technology (SMT) connections such as SMT connectors and cables.

Many high-speed connectors take advantage of the form factor of SMT connectors, which are known to improve signal integrity when compared with other, bulkier designs. SMT cables are also becoming increasingly popular as they avoid the need for connectors altogether to avoid paddle board and connector impairments. Despite their advantages, both SMT connectors and SMT cables have a number of drawbacks. For example, depending on the direction signal traces break out from SMT components on a board, pads or lead frames of the SMT connector or cable may leave exposed an unused conductive region on the board that oftentimes causes undesired parasitic effects that greatly degrade signal quality and wipe out much of the gains archived by using SMT connections in the first place. In addition, in belly-to-belly connector applications heavy congestion of signals involving vias and differential trace breakouts tend to degrade signal integrity at higher frequencies. Accordingly, it is highly desirable to find new ways to mitigate or eliminate such undesired effects without negatively impacting signal integrity.

BRIEF DESCRIPTION OF THE DRAWINGS

References will be made to embodiments of the disclosure, examples of which may be illustrated in the accompanying figures. These figures are intended to be illustrative, not limiting. Although the accompanying disclosure is generally described in the context of these embodiments, it should be understood that it is not intended to limit the scope of the disclosure to these particular embodiments.

DETAILED DESCRIPTION OF THE PREFERRED EMBODIMENTS

In the following description, for purposes of explanation, specific details are set forth in order to provide an understanding of the disclosure. It will be apparent, however, to one skilled in the art that the disclosure can be practiced without these details. Furthermore, one skilled in the art will recognize that embodiments of the present disclosure, described below, may be implemented in a variety of ways, such as a process, an apparatus, a system/device, or a method on a tangible computer-readable medium.

Components, or modules, shown in diagrams are illustrative of exemplary embodiments of the disclosure and are meant to avoid obscuring the disclosure. It shall also be understood that throughout this discussion that components may be described as separate functional units, which may comprise sub-units, but those skilled in the art will recognize that various components, or portions thereof, may be divided into separate components or may be integrated, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," "communicatively coupled," "interfacing," "interface," or any of their derivatives shall be understood to include direct connections, indirect connections through one or more intermediary devices, and wireless connections. It shall also be noted that any communication, such as a signal, response, reply, acknowledge, message, query, etc., may comprise the exchange of one or more messages.

Reference in the specification to "one embodiment," "preferred embodiment," "an embodiment," or "embodiments" means that a particular feature, structure, characteristic, or function described in connection with the embodiment is included in at least one embodiment of the disclosure and may be in more than one embodiment. Also, the appearances of the above-noted phrases in various places in the specification are not necessarily all referring to the same embodiment or embodiments.

The use of certain terms in various places in the specification is for illustration and should not be construed as limiting. The terms "include," "including," "comprise," and "comprising" shall be understood to be open terms and any lists the follow are examples and not meant to be limited to the listed items. The words "optimal," "optimize," "optimization," and the like refer to an improvement of an outcome or a process and do not require that the specified outcome or process has achieved an "optimal" or peak state.

It shall be noted that any experiments and results provided herein are provided by way of illustration and were performed under specific conditions using a specific embodiment or embodiments; accordingly, neither these experiments nor their results shall be used to limit the scope of the disclosure of the current patent document.

It shall also be noted that although embodiments herein may be described within the context of SMT connectors, aspects of the present disclosure are not so limited. As a person of skill in the art will appreciate that the teachings described herein may improve signal integrity in other circuits that exhibit similar or different transmission line effects and undesirable crosstalk. Accordingly, the aspects of the present disclosure may be applied or adapted for use in many other contexts. In this document a "belly-to-belly" arrangement refers to a configuration in which two elements are mounted on two different sides of a PCB, typically with one element on top of the PCB and another element upside down on the bottom.

Ever-increasing demands on bandwidth and thus transmission speeds for digital signal processing require higher and higher operating frequencies, i.e., high-speed signals that have shorter and shorter wavelengths and signals with picosecond rise times. As is known in the art, once the geometrical dimensions of conductors and other conductive structures shrink to levels that are comparable to the electrical wavelengths of the signals transmitted by such conductors, this gives rise to transmission line effects. Oftentimes, these effects change the electrical transmission characteristics of a communication channel in a manner that result in unwanted signal distortion, increased insertion loss (single-ended or differential), and other non-linearities that can adversely affect signal integrity.

For example, once the length of a via, e.g., a plated through-hole representing a branch of a tee junction in a signal path, in an integrated circuit is at or about a quarter-wavelength of the high-frequency electrical signal in the signal path, the via behaves like an open circuit transmission line, even if the via itself has not been designed to carry any high-frequency signals.

To ameliorate adverse transmission line effects of vias on signal integrity and improve insertion loss, common design considerations involve shielding of ground vias, choice of desired signal and ground via assignments, and mechanical back drilling that removes (i.e., drills out) conductive material (e.g., copper) from unused portions of the via, which may then be filled with a dielectric material, such as an electrically non-conductive epoxy. Such added and costly manufacturing steps introduce their own mechanical and electrical drawbacks, e.g., differing thermal expansion coefficients of the epoxy and the plated via, and the like.

Figure 1:
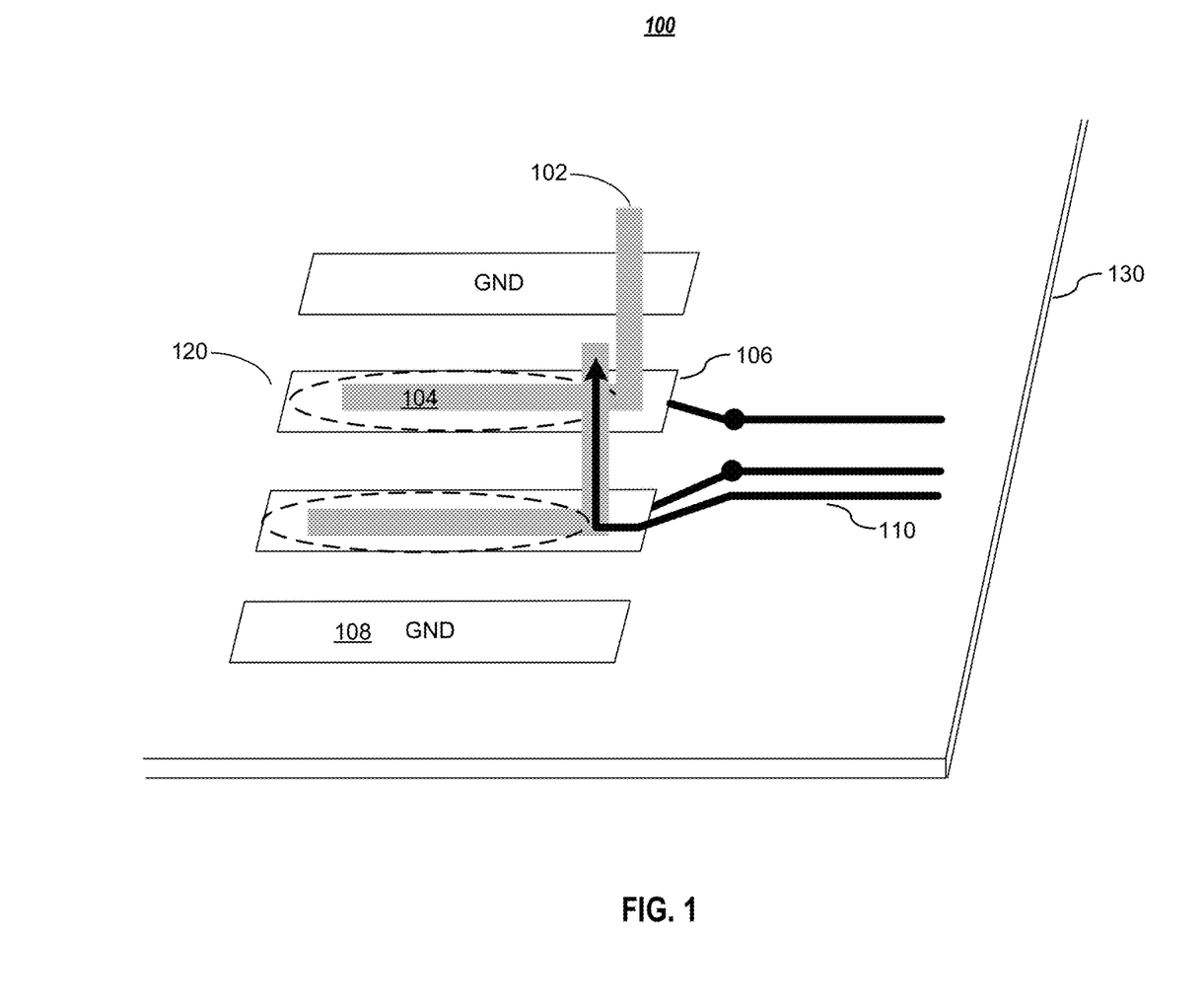
FIG. 1 depicts a simplified SMT circuit having differential pair traces that break out in a direction towards an edge of a PCB.

FIG. 1 depicts a simplified SMT circuit having common differential pair traces located at a top layer of a PCB that break out in a direction towards the edge of the PCB and expose an unused pad portion that forms an unwanted resonant stub. Circuit 100 circuit may be implemented on a PCB (indicated by PCB edge 130) and used, for example, for 28 GB/sec non-return-to-zero (NRZ) signaling. SMT circuit 100 comprises a lead frame that includes connector pin 102 and pin leg 104, and further comprises connector pad 106, and a signal path 110 that includes connector pin 102. Circuit components 102-106 may be formed from electrically conductive material, e.g., copper that is mounted on non-conductive PCB material, such as FR4 dielectric that is not shown in FIG. 1. Also not shown in FIG. 1 are conductive ground strips that may serve as return paths for electrical signals.

As depicted in FIG. 1, both pin leg 104 and the area of connector pad 106, which extend to the left-hand-side of connector pin 102, are not considered part of signal path 110. In other words, pin leg 104 and most of connector pad 106 that are directed away from the edge 130 of the PCB and signal path 110 are "unused" portions, regions, or areas, as indicated by dashed lines 120 in FIG. 1. At high operating frequencies, e.g., in the GHz frequency range or in the presence of high-speed signals that depending on data rates have relatively short rise times in the picosecond range, these unused portions 120 of SMT circuit 100 are subject to transmission line effects, in particular, when their physical size becomes comparable to their electrical length. Unused portion 120 of circuit 100 generates undesired resonances, antenna effects and, under certain circumstances, behaves like an open-ended transmission line, i.e., an unterminated resonant stub that acts a notch filter.

In practice, these effects (hereinafter collectively "pad resonance") depend mainly on the length of the electrically conductive stub and, more generally, on geometry, i.e., electrical inductance and capacitance, which are functions of geometry, that determine the presence and locations of resonance frequencies associated with SMT circuit 100.

Figure 2:
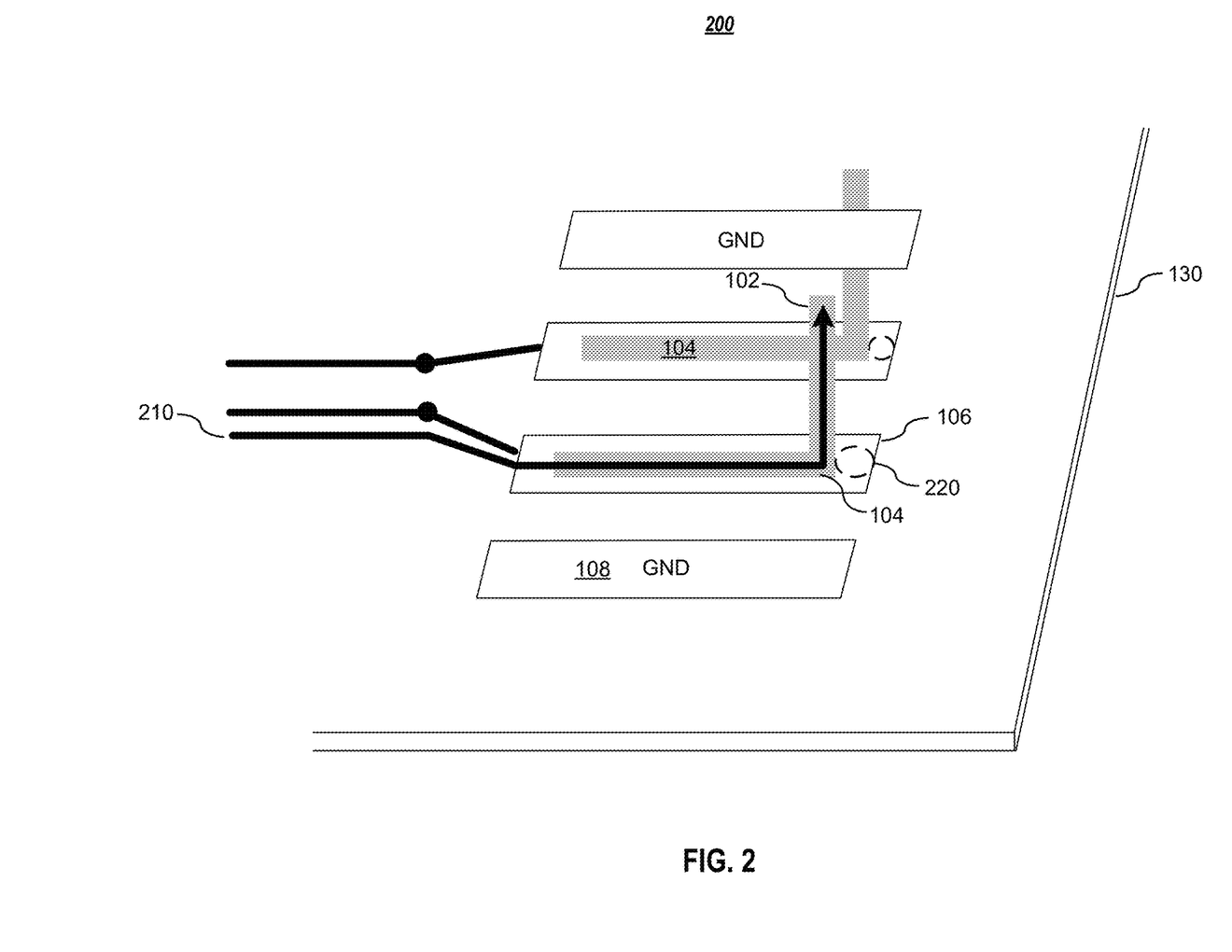
FIG. 2 depicts a simplified SMT circuit having differential pair traces that break out in a direction away from the edge of a PCB.

FIG. 2 depicts a simplified SMT circuit having differential pair traces that break out in a direction away from the edge of a PCB to reduce or eliminate unwanted resonant stub effects. Similar to the SMT circuit in FIG. 1, connector pin 102 and pin leg 104 in SMT circuit 200 are part of a lead frame. SMT circuit 200 comprises connector pad 106, ground strip 108, and a portion of signal path 210 that includes connector pin 102.

Circuit 200 has a signal breakout design that utilizes pin leg 104 and that part of the metal pad area that extend to the left-hand-side of connector pin 102 as part of signal path 210. Unlike the arrangement in FIG. 1, signal path 210 is directed away from the edge 130 of the PCB. This reduces the dimensions of the potential resonant structure formed by pin leg 104 and pad area 106 to unused portion 220 and, thereby, suppresses unwanted resonance effects. As a rule of thumb, the greater the length or physical dimension of an unused portion is, i.e., the larger the coupling area, the greater the capacitive coupling to signal path 110 and the more adverse the effects of pad resonance is on crosstalk and, thus, on signal integrity.

Several approaches for reducing unwanted transmission line effects in SMT connections are discussed in U.S. patent application Ser. No. 16/882,427, filed on May 22, 2020, entitled "Plated Pads and Leads for Surface Mount Technology Connections," and listing Umesh Chandra and Bhyrav Mutnury as inventors, and U.S. patent application Ser. No. 16,888,644, filed on May 29, 2020, entitled "Surface Mount Pads for Next Generation Speeds," and listing Umesh Chandra, Douglas Wallace, and Bhyrav Mutnury as inventors, which patent documents are incorporated by reference herein in their entirety. One implementation of SMT circuit 200 on a PCB, which may be used, e.g., in a Quad Small Form-Factor Pluggable Double Density (QSFP DD) connector is shown in FIG. 3.

Figure 3:
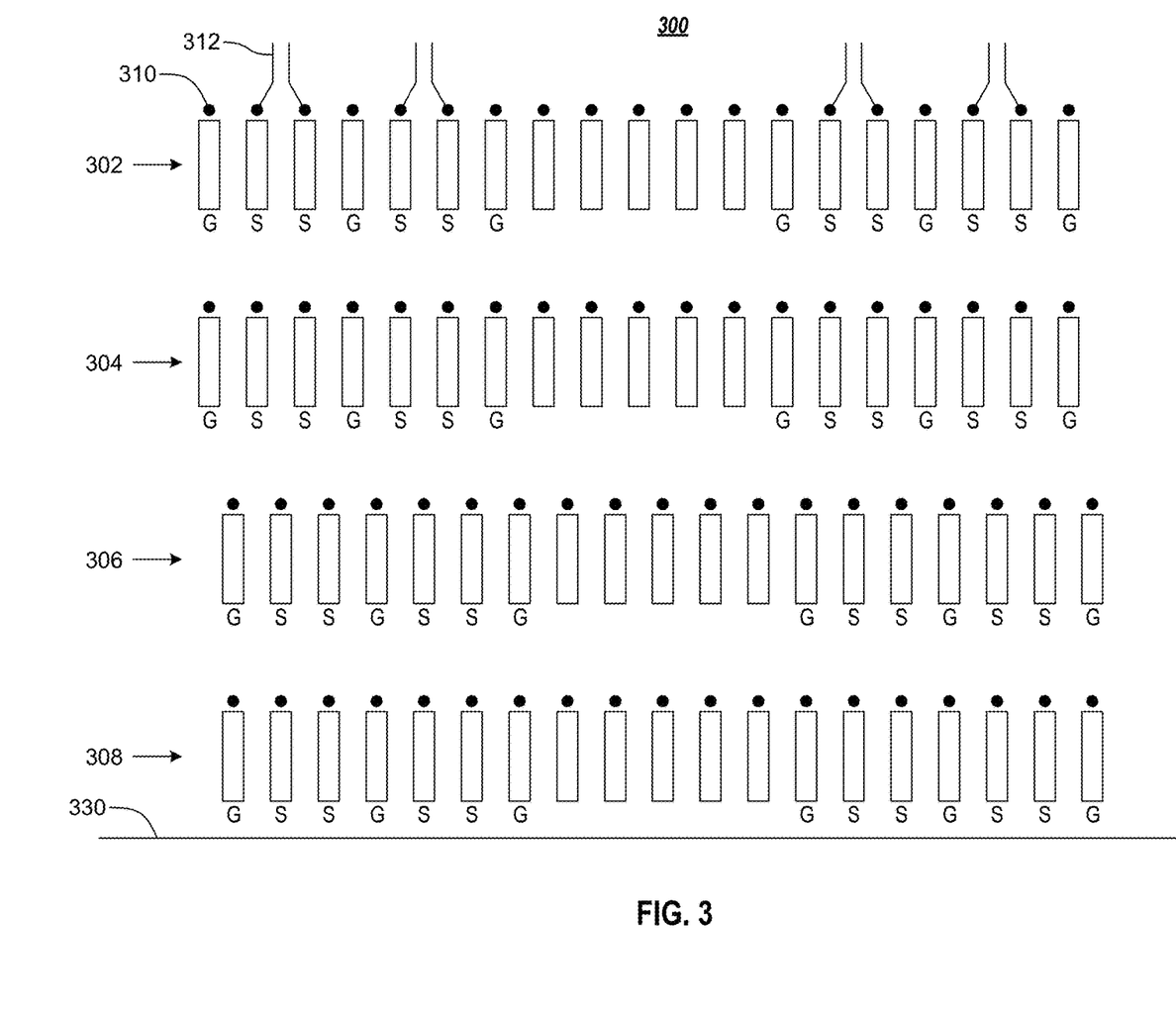
FIG. 3 is a top view of a PCB illustrating differential pair traces located at upper layers of the PCB that break out in a direction away from the edge of the PCB.

FIG. 3 depicts a top view of a PCB having differential pair traces that are located on top of the PCB and that break out in a direction away from the edge of the PCB. PCB 300 in FIG. 3 comprises four rows 302-308 of SMT pads (e.g., 310)

with each row 302-308 comprising a number of differential pairs (e.g., 312) and having a common trace structure ground-signal-signal-ground (GSSG).

Such an arrangement is used, e.g., in a high-speed SMT connector, such as a QSFP DD connector that typically comprises connector lead frames that are bent in a direction away from edge 330 of PCB 300 and are then soldered on to an SMT pad on the PCB, as illustrated in FIG. 3. Breaking out differential pair trace 312 from PCB 300 in this manner ensures that stub-effects introduced by SMT pads (e.g., 310) and its associated connector lead frame are minimized or eliminated according to the principles discussed above with reference to FIG. 2.

As will be discussed with reference to FIG. 5, certain designs, such as those involving a stripline breakout away from a connector footprint area, may nevertheless introduce unwanted reflections and loss of signal quality. Further, given limited board space, it is not always feasible to accommodate breakouts away from the connector footprint area for all rows 302-308 of an SMT connector.

Attempts to alleviate these problems include staggering the locations of top-mounted and bottom-mounted connectors on a faceplate to reduce the crowding of vias. However, in practice, such approaches are limited by the available space in the faceplate (not shown) and have their own drawbacks, such as significantly impairing serviceability and overcrowding of via locations.

Figure 4:
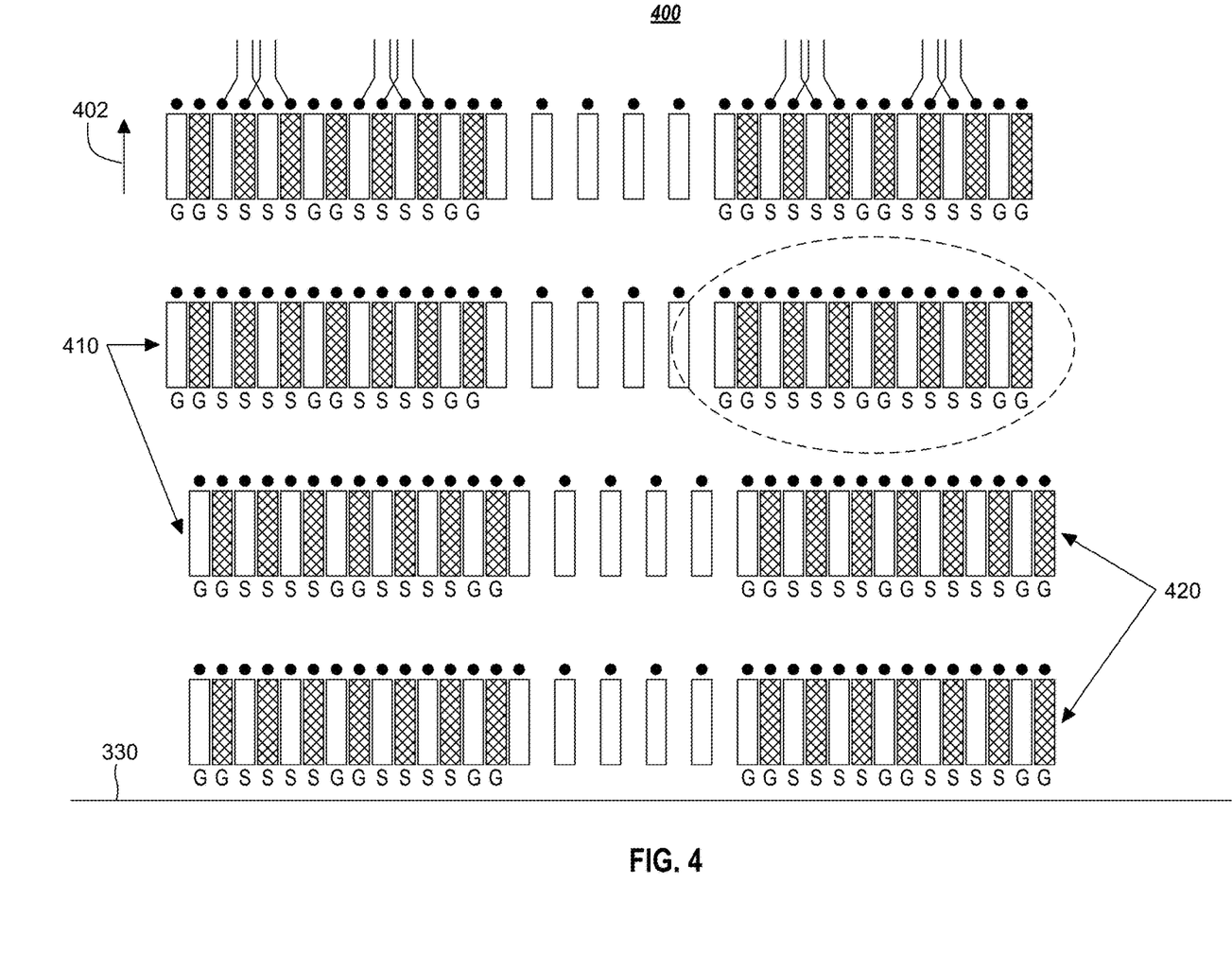
FIG. 4 is a top view of a PCB illustrating differential pair traces located at upper and bottom layers of the PCB that break out in a direction away from the edge of the PCB.

FIG. 4 is a top view of a PCB illustrating differential pair traces located at upper layers and bottom layers of the PCB that break out in a direction 402 away from the edge of the PCB. PCB 400 represents a belly-to-belly geometry, i.e., one in which connectors, e.g., QSFP DD SMT connectors are affixed to both planar sides of PCB 400. The GSSG trace structure for the top-mounted connector and the GSSG trace structure for the bottom-mounted connector are superimposed.

As may be gleaned from FIG. 4, such a belly-to-belly configuration may lead to heavy congestion of trace breakouts and differential vias within PCB 400. One main drawback of such an arrangement is that the resulting capacitive coupling may cause losses and highly undesirable crosstalk between signals that travel in adjacent electrical paths, e.g., disadvantageously resulting in a significant increase in bit error rate. A common attempt to reduce overly dense interconnects and associated unwanted side-effects is to break out various layers of PCB 400 that are connected to blind vias, as will be discussed next.

Figure 5:
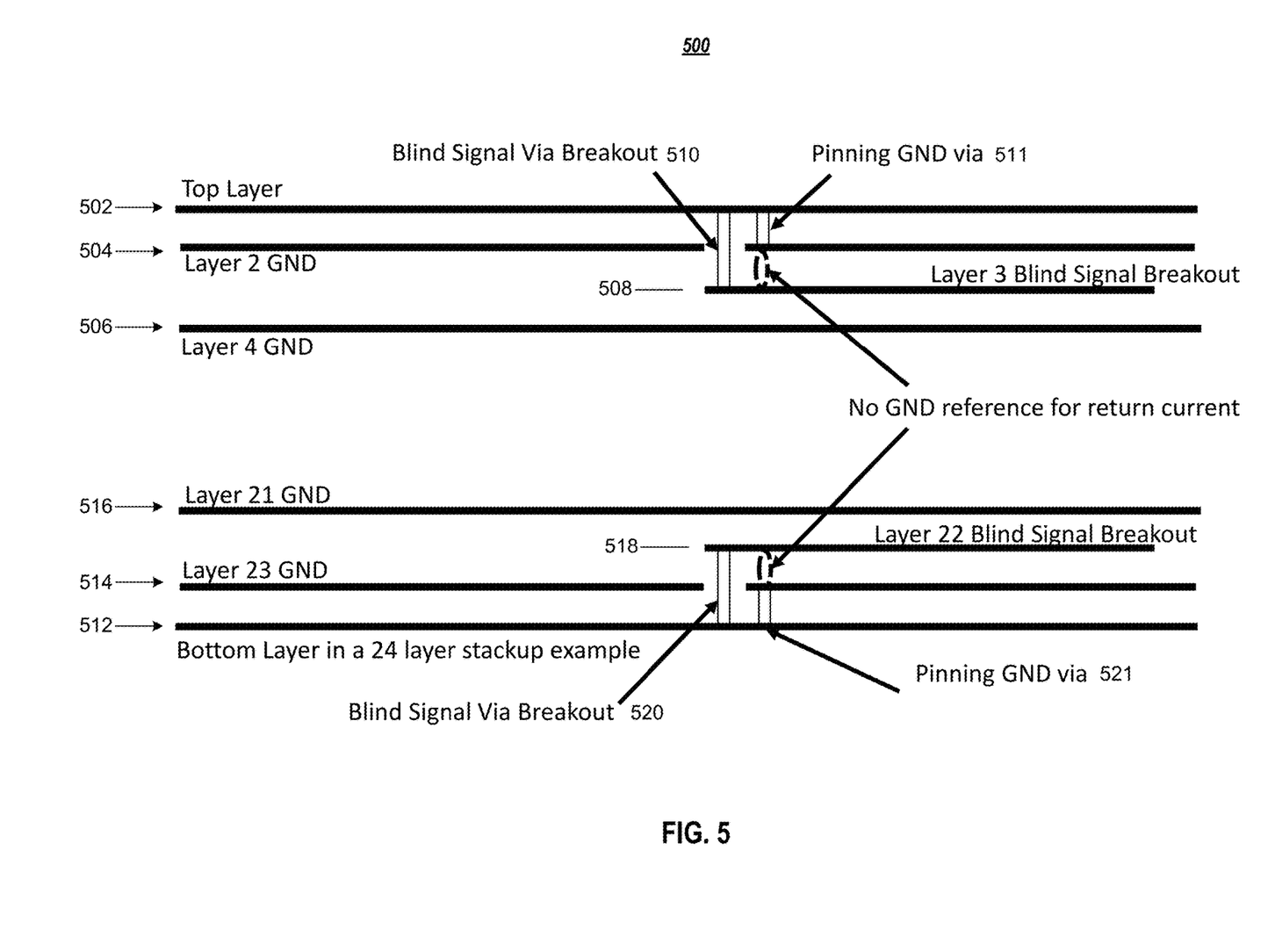
FIG. 5 is a cross-sectional view of a PCB illustrating stripline differential pair traces located at upper and lower layers of the PCB and breaking out in the same direction.

FIG. 5 is a cross-sectional view of a PCB illustrating stripline differential pair traces located at upper and lower layers of the PCB. PCB 500 comprises top layer 502, ground layers 504, 506, and signal layer 508 that together with ground layers 504 and 506 forms a stripline that follows a transition from a microstrip that is formed by top layer 502 and ground layer 504. Similarly, PCB 500 comprises bottom layer 512, ground layers 514, 516, and signal layer 518 that together with ground layers 514 and 516 forms a second stripline adjacent to a microstrip formed by bottom layer 512 and ground layer 514. Each of layers 508 and 518 constitute an intermediate layer of a differential signal that breaks out from PCB 500 in the same direction enabling top-mounted and bottom-mounted connectors to form the belly-to-belly configuration mentioned above with reference to FIG. 4.

As shown in FIG. 5, the breakouts occur at blind vias 510 and 520, which extend from respective top and bottom layers 502, 512 to respective intermediate signal layers 508, 518 though recesses (anti-pads) in respective layers 504 and 514. Blind vias that connect signal lines in different layers in a multilayer stack are frequently used to reduce or eliminate the presence of unwanted stub-effects that may otherwise be introduced, e.g., due to back-drilling tolerance.

In addition, PCB 500 comprises pinning ground via 511 that due to manufacturing is implemented as a blind via, i.e., it must terminate on layer 504 that serves as a ground reference plane for the differential stripline. However, this arrangement precludes the formation of a ground reference for blind via 510 between layer 504 and layer 508, as indicated by the dashed line in FIG. 5, which indicates a discontinuity in which half of blind via 510 has no proper ground reference, thus, adding to the signal line discontinuity that the geometry of blind via 510 itself constitutes when compared to the planar layers 502, 508 it connects.

Therefore, in addition to severe crowding of signal via 510 and ground vias 511 caused by differential breakouts in the same direction, existing designs lack a proper return path for currents flowing back onto PCB 500 through layer 508. As a result, transmission line impedance at these locations is uncontrolled, causing an impedance mismatch that aside from electromagnetic interference issues gives rise to unwanted reflections that ultimately degrades signal integrity for top-mounted connectors associated with layers 502-506. A person of skill in the art will understand that for similar reasons signal integrity similarly degrades for bottom-mounted connectors associated with layers 512-516.

Some existing approaches involve limiting the maximal trace length from the data processing unit to the connector, e.g., to meet relevant IEEE specifications. Other approaches increase the layer count or use dielectric material that has a low dissipation factor. However, this not only increases manufacturing cost, but also may not be feasible for next-generation data rates, e.g., for 112G PAM4 signaling. Accordingly, it would be desirable to have low-cost designs and methods that reduce unwanted transmission line effects in SMT connections and provide superior electrical performance and reliability for next-generation speeds.

Figure 6:
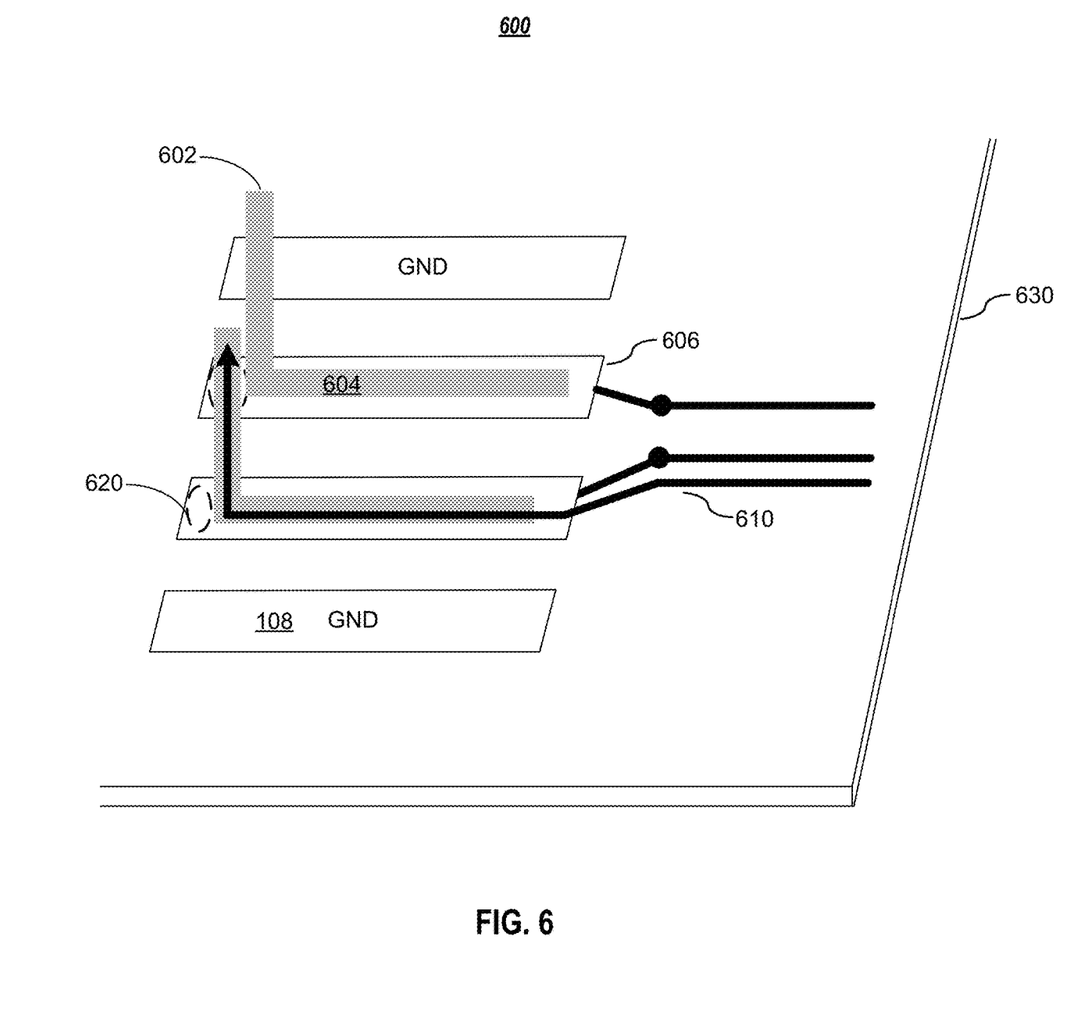
FIG. 6 depicts a simplified SMT circuit having differential pair traces that break out in a direction towards the edge of a PCB, according to various embodiments of the present disclosure.

FIG. 6 depicts a simplified SMT circuit having differential pair traces that break out in a direction towards the edge of a PCB, according to various embodiments of the present disclosure. In one or more embodiments, SMT circuit 600 comprises connector pin 602, pin leg 604, connector pad 606, ground strip 608, and a portion of signal path 610 that includes connector pin 602. Circuit components 602-608 may be formed of electrically conductive material and mounted on non-conductive PCB material (not shown).

Circuit 600 may have a signal breakout design that, in embodiments, utilizes pin leg 604 and utilizes part of the metal pad area that is on the right-hand-side of connector pin 602 as part of signal path 610. By designing pin leg 604 and most of pad 606 a part of signal path 610, this approach reduces the dimensions of the potential resonant structure formed by pin leg 604 and pad area 606 to unused portion 620 and, thereby, suppresses unwanted resonance effects that may cause, e.g., insertion loss.

In other words, by designing unused portion 620 to be relatively short in one or more physical dimensions, in embodiments, locations of resonant frequencies created by virtue of the presence and structure of unused portion 620 may be shifted toward higher frequencies located far beyond a frequency of interest of an electrical signal in path 610. As a result, unused portion 620 is less likely to interfere with the electrical signal in signal path 610, thereby, improving the integrity of the electrical signal.

In addition to reducing or eliminating unwanted resonant stub effects, in one or more embodiments, the signal breakout design in circuit 600 in which pin leg 604 and is bent in a direction towards the edge 630 of a PCB allows for differential pair traces 610 to break out in a direction towards the edge 630 of the PCB.

In one or more embodiments, when combined with existing configurations, such as those represented in FIG. 2, this advantageously reduces overcrowding and related unwanted side-effects such as those mentioned with reference to in FIG. 4, e.g., by allowing traces of top-mounted and bottom-mounted connectors to break out in opposite directions as discussed next.

Figure 7:
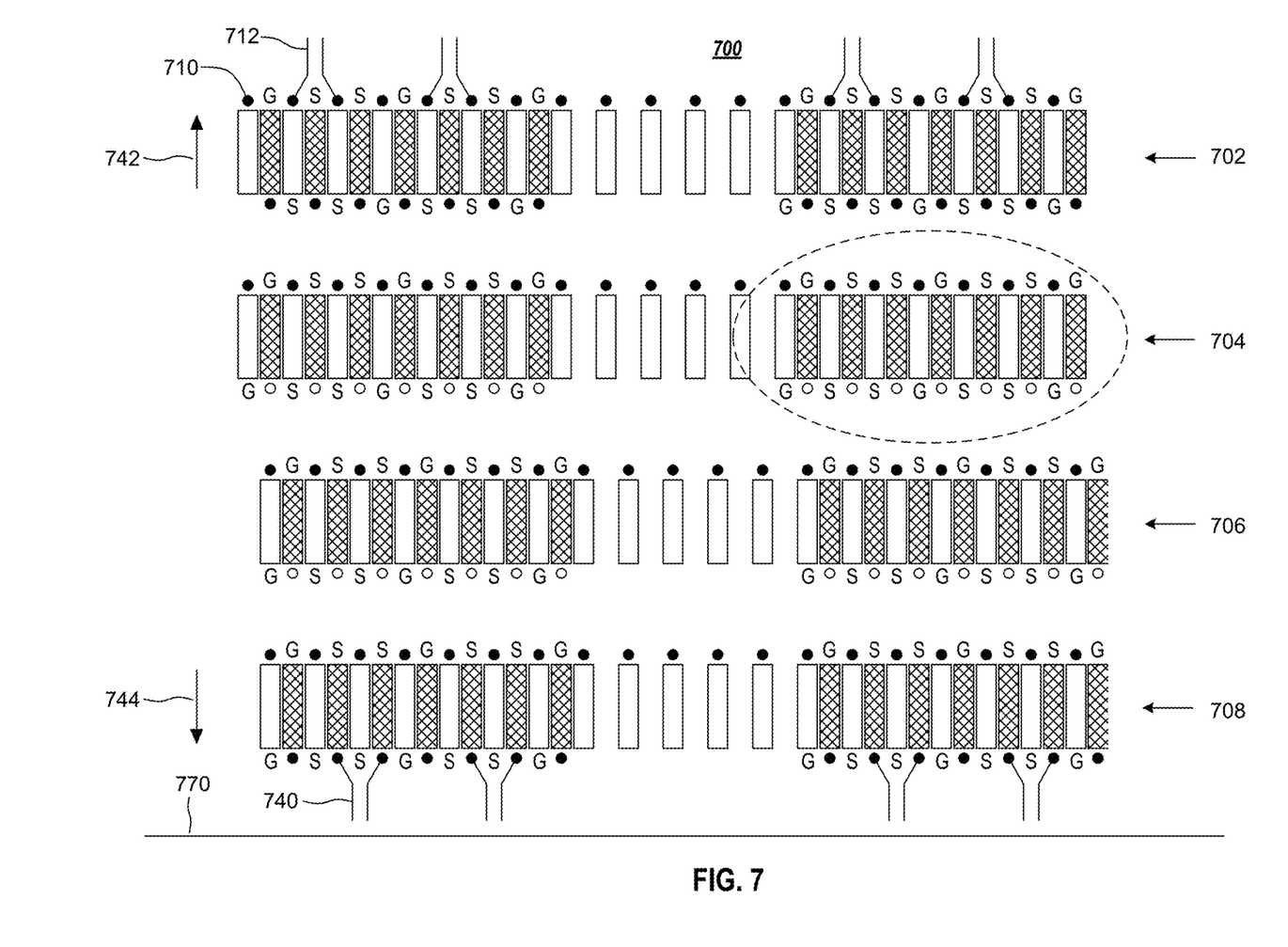
FIG. 7 is a top view of a PCB illustrating traces breaking out in opposite directions according to various embodiments of the present disclosure.

FIG. 7 is a top view of a PCB illustrating traces breaking out in opposite directions according to various embodiments of the present disclosure. PCB 700 comprises four rows 702-708 of SMT pads, each row comprising a number of differential pair traces (e.g., 712).

In one or more embodiments, the top-mounted SMT high-speed connector has lead frames that are bent in a direction 742 away from the edge 770 of the PCB, whereas the bottom-mounted SMT high-speed connector has lead frames that are bent in a direction 744 towards the edge 770 of the PCB to minimize or eliminate unwanted stub-effects introduced by SMT pads. Similarly, the differential pair traces (e.g., 712) and blind via differential stripline breakouts for the top-mounted SMT high-speed connector exit in a direction 742 away from the edge 770 of the PCB, whereas the differential pair traces (e.g., 740) and blind via differential stripline breakouts for the bottom-mounted SMT high-speed connector exit in a direction 744 towards the edge 770 of the PCB to prevent overcrowding of signal via and ground via locations associated with the traditional lead frame designs.

Unlike in existing designs, in one or more embodiments, this approach obviates the need for pinning ground vias to be blind vias that lack proper ground return current paths and impedance control measures for at least some portion of the blind vias for differential stripline breakout. In one or more embodiments, the pinning ground vias may be implemented as traditional ground vias that may go through the entire PCB for both top and bottom mounted connectors.

In one or more embodiments, some of the signal traces associated with SMT rows 702-708 of the top-mounted connector need not be all bent away from edge 770 of the board. Instead, some of SMT rows 702-708 may alternate, e.g., where the first row 702 is positioned away from edge 770, the second row 704 is bent towards edge 770, and so on. Conversely, the bottom-mounted connector may have corresponding rows bent in a direction opposite to that of the top-mounted connector.

Figure 8:
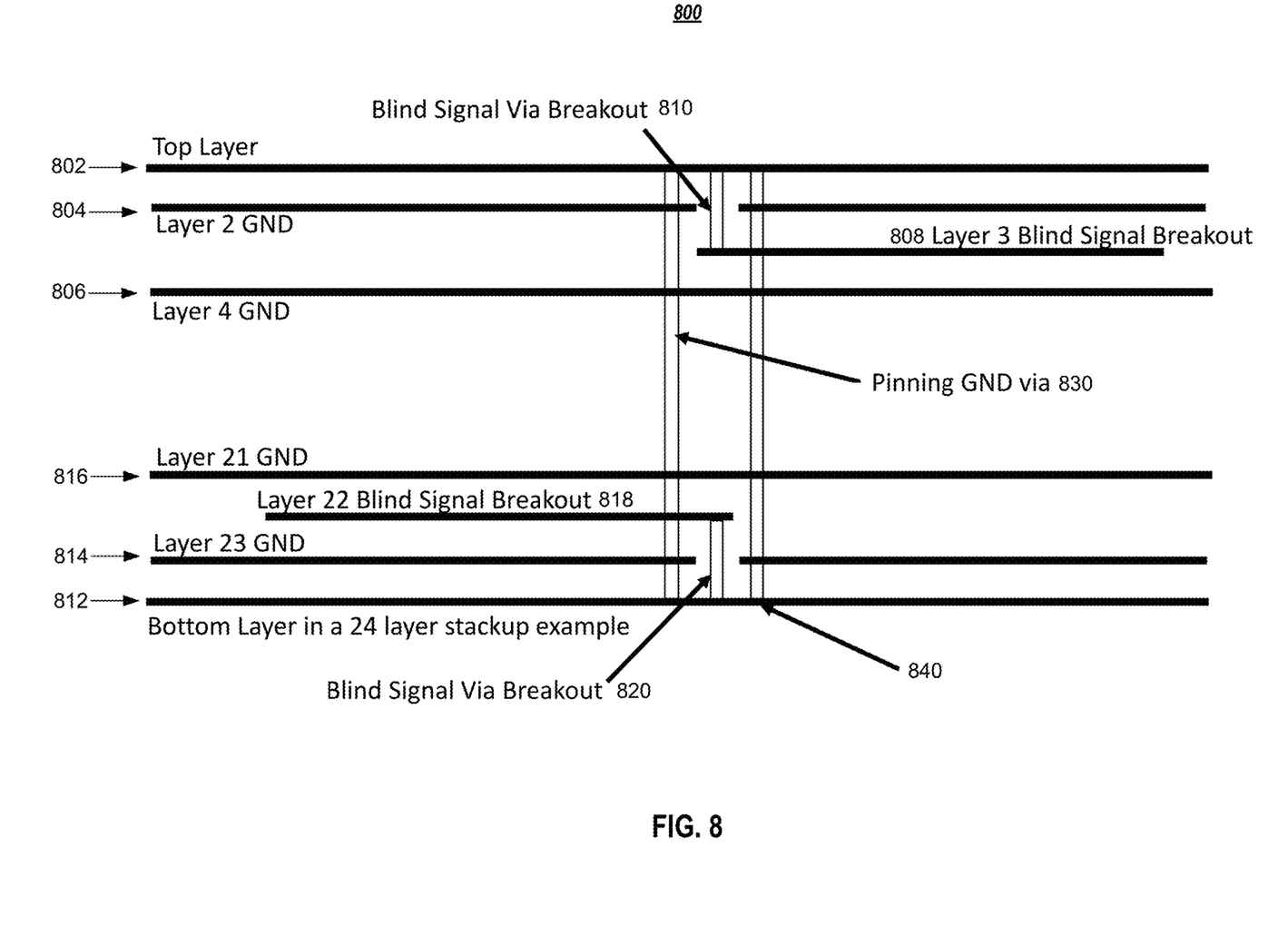
FIG. 8 is a cross-sectional view of a PCB illustrating stripline differential pair traces located at top and bottom layers of the PCB breaking out in opposite directions according to various embodiments of the present disclosure.

FIG. 8 is a cross-sectional view of a simplified multilayered PCB illustrating stripline differential pair traces located at top and bottom layers of the PCB breaking out in opposite directions according to various embodiments of the present disclosure. For simplicity, dielectric layers and other circuitry are omitted. In one or more embodiments, PCB 800 comprises in a stack of layers top layer 802, ground layers 804, 806, blind via 810, pinning ground vias 830, 840 and signal layer 808 that together with ground layers 804 and 806 forms a stripline that follows a transition from a microstrip configuration that is formed by topmost layer 802 and ground layer 804. PCB 800 further comprises PCB 800 comprises bottom layer 812, ground layers 814, 816, blind via 820, and signal layer 818 that together with ground layers 814 and 816 forms a second stripline adjacent to a microstrip formed by bottom layer 812 and ground layer 814.

In one or more embodiments, unlike in existing designs in which pinning ground vias are implemented as blind vias as shown in in FIG. 5, pinning ground vias 830, 840 in FIG. 8 may be implemented, e.g., as a plated through holes that may extend, e.g., from topmost layer 802 to bottom layer 812. In one or more embodiments, pinning ground vias (e.g., 830) may extend, at least, from layer 802 to layer 808, thus, enabling PCB 800 to account for return currents and providing a suitable ground reference for blind via 810. As a result, discontinuities in transmission line impedance and, thus, unwanted reflections that otherwise would degrade signal integrity are successfully avoided for both top-mounted and bottom-mounted connectors.

In one or more embodiments, disposing pinning ground vias 830, 840 apart from each other and from blind vias 810, 820 further allows to eliminate severe crowding of signal and ground vias. It is noted that although circuit 800 is shown as being implemented in a microstrip-to-stripline configuration, this is not intended as a limitation on the scope of the present disclosure, since the teachings herein may equally apply to other designs than those discussed herein.

It is understood that the structures of PCB 800, such as blind vias, may be produced using any semiconductor fabrication method available in the art, such as deposition, etching, electroplating steps, laser drilling, and so on.

Figure 9:
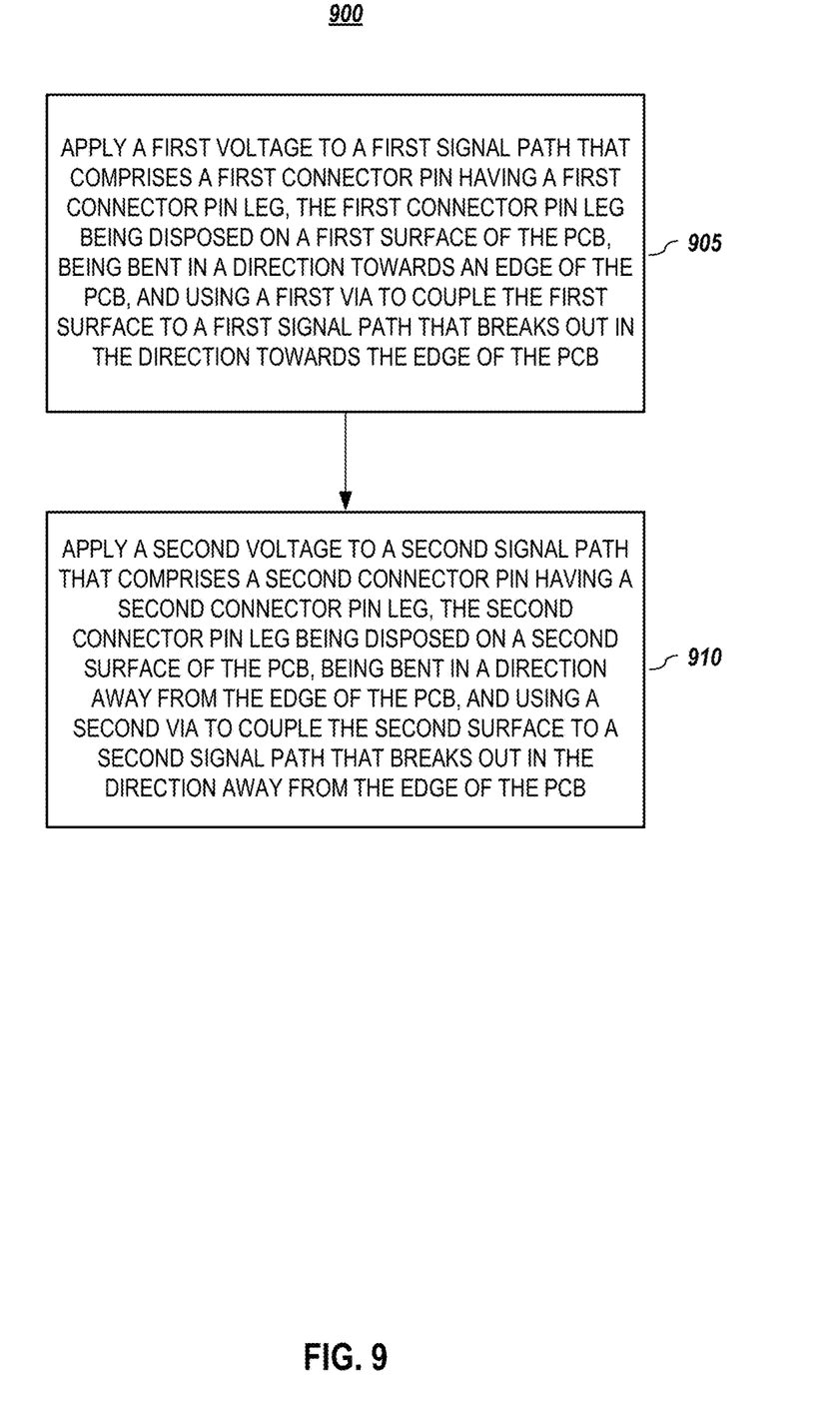
FIG. 9 is a flowchart illustrating a process for reducing or eliminating unwanted resonant stub effects while controlling impedance of a high-speed signal breakout on a PCB, according to embodiments of the present disclosure.

FIG. 9 is a flowchart illustrating a process for reducing or eliminating unwanted resonant stub effects while controlling impedance of a high-speed signal breakout on a PCB, according to embodiments of the present disclosure. In one or more embodiments, process 900 may begin when a first voltage is applied (905) to a first signal path that comprises a first connector pin having a first connector pin leg. In one or more embodiments, the first connector pin leg may be disposed on a first surface of the PCB, may be bent in a direction towards an edge of the PCB, and may use a first via to couple the first surface to a first signal path that breaks out in the direction towards the edge of the PCB.

A second voltage may be applied (910) to a second signal path that comprises a second connector pin having a second connector pin leg. In one or more embodiments, the second connector pin leg may be disposed on a second surface of the PCB, may be bent in a direction away from the edge of the PCB, and may use a second via to couple the second surface to a second signal path that breaks out in the direction away from the edge of the PCB. It shall be noted that: (1) certain steps may optionally be performed; (2) steps may not be limited to the specific order set forth herein; (3) certain steps may be performed in different orders; and (4) certain steps may be done concurrently.

One skilled in the art will recognize no computing system or programming language is critical to the practice of the present disclosure. One skilled in the art will also recognize that a number of the elements described above may be physically and/or functionally separated into sub-modules or combined together.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A circuit comprising:
a first pin leg positioned in a direction towards a first edge of a printed circuit board (PCB) and using a first via to couple a first surface of the PCB to a first signal path that beaks out in the direction towards the first edge; and
a second pin leg positioned in a direction towards a second edge of the PCB and being disposed on a second surface of the PCB opposite to the first surface of the PCB, the second pin leg using a second via to couple the second surface of the PCB to a second signal path that breaks out in the direction towards the second edge.

2. The circuit of claim 1, further comprising a signal via that couples the first surface of the PCB and the first signal path.

3. The circuit of claim 2, wherein the signal via is a blind via.

4. The circuit of claim 1, wherein the first signal path is arranged in a stripline configuration and is at least partially formed between a first ground path and a second ground path.

5. The circuit of claim 4, wherein the first ground path is disposed adjacent to the first surface of the PCB.

6. The circuit of claim 4, wherein the first ground path and at least a portion of the first surface of the PCB form a micro strip.

7. The circuit of claim 4, further comprising a ground via that couples the first surface of the PCB to the first ground path, the first signal path, and the second ground path to reduce unwanted signal emissions.

8. The circuit of claim 7, wherein the ground via is a plated through hole that extends from the first surface of the PCB to the second surface of the PCB.

9. The circuit of claim 7, wherein a portion of the ground via that extends from the first surface of the PCB to the first signal path serves as a return path for a signal via that couples the first surface of the PCB with the first signal path.

10. A circuit comprising:
a pin leg positioned in a direction towards an edge of a printed circuit board (PCB) and using a first via in the PCB to couple a first surface of the PCB to a first signal path in the PCB, first signal path being at least partially formed between a first ground path and a second ground path and breaking out in the direction towards the edge; and
a ground via that couples the first surface of the PCB to the first ground path, the first signal path, and the second ground path to reduce unwanted signal emissions.

11. The circuit of claim 10, wherein a portion of the ground via that extends from the first surface to the first signal path serves as a return path for a signal via that couples the first surface with the first signal path.

12. The circuit of claim 10, wherein the ground via is a plated through hole that extends from the first surface of the PCB to the second surface of the PCB.

13. The circuit of claim 10, further comprising a blind via that couples the first surface of the PCB with the first signal path.

14. The circuit of claim 10, wherein the first ground path and at least a portion of the first surface of the PCB form a micro strip.

15. A method for reducing or eliminating unwanted resonant stub effects while controlling impedance of a signal breakout on a printed circuit board (PCB), the method comprising:
applying a first voltage to a first signal path coupled to a first connector pin having a first connector pin leg that is disposed on a first surface of the PCB, is positioned in a direction towards a first edge of the PCB, and uses a first via to couple the first surface of the PCB to the first signal path that breaks out in the direction towards the first edge; and
applying a second voltage to a second signal path coupled to a second connector pin having a second connector pin leg that is disposed on a second surface of the PCB, is positioned in a direction towards a second edge of the PCB, and uses a second via to couple the second surface of the PCB to the second signal path that breaks out in the direction towards the second edge.

16. The method of claim 15, further comprising a blind via that couples the first surface of the PCB with the first signal path.

17. The method of claim 15, wherein the first signal path is arranged in a stripline configuration, the first signal path being at least partially formed between a first ground path and a second ground path.

18. The method of claim 17, further comprising a ground via that couples the first surface of the PCB to the first ground path, the first signal path, and the second ground path to reduce unwanted signal emissions, the ground via not being a blind via.

19. The method of claim 18, wherein a portion of the ground via that extends from the first surface of the PCB to a second layer serves as a return path for a signal via that couples the first surface of the PCB with the first signal path.

20. The method of claim 18, wherein the first ground path and at least a portion of the first surface of the PCB form a microstrip.

* * * * *